(12) United States Patent
Johansson et al.

(10) Patent No.: US 11,795,384 B2
(45) Date of Patent: Oct. 24, 2023

(54) NANOPARTICLE, STRUCTURE, AND METHOD FOR PRODUCING A NANOPARTICLE

(71) Applicant: OSRAM Opto Semiconductors GmbH, Regensburg (DE)

(72) Inventors: Erik Johansson, Portland, OR (US); Robert Fitzmorris, Portland, OR (US); Peter Chen, New Haven, CT (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 4 days.

(21) Appl. No.: 17/541,148

(22) Filed: Dec. 2, 2021

(65) Prior Publication Data

US 2023/0174850 A1     Jun. 8, 2023

(51) Int. Cl.
*C09K 11/02*     (2006.01)
*H01L 33/50*     (2010.01)

(52) U.S. Cl.
CPC ............ *C09K 11/025* (2013.01); *C09K 11/02* (2013.01); *H01L 33/502* (2013.01); *C01P 2004/50* (2013.01); *C01P 2004/64* (2013.01); *C01P 2004/80* (2013.01)

(58) Field of Classification Search
CPC ... C09K 11/02; C09K 11/025; C01P 2004/80; C01P 2004/64; C01P 2004/50
See application file for complete search history.

(56) References Cited

U.S. PATENT DOCUMENTS

2019/0086733 A1    3/2019  Min et al.
2021/0130683 A1*   5/2021  Zhang .................. C09K 11/616

FOREIGN PATENT DOCUMENTS

WO        2016046216 A1    3/2016
WO    WO 2020/010938    *  1/2020

OTHER PUBLICATIONS

Boercker J. E. et al.,"Synthesis and Characterization of Pbs/ZnS Core/Shell Nanocrystals", Chemistry of Materials, 2018, 30, 12, pp. 4112-4123; DOI:10.1021/acs.chemmater.8b01421.
Mashford B. et al.,"Synthesis of quantum dot doped chalcogenide glasses via sol-gel processing", Journal of Applied Physics, 109 (9) 94305, 2011, pp. 1-7.
Nishimura D. et al., "Z01-3639-Embedding Quantum Dots with High Quantum Yield in Inorganic Matrix by Sol-Gel Method" Prime 2020; A joint international meeting, Oct. 4-9, 2020, pp. 1-2, abstract only.
"Inorganic Zinc Silicate Primers", Dulux Protective Coatings; Tech Note 3.8.1; Oct. 2014, pp. 1-3.
International Seach Report and Written Opinion in PCT/EP2022/083480, dated Mar. 15, 2023, 10 pages.

* cited by examiner

*Primary Examiner* — C Melissa Koslow
(74) *Attorney, Agent, or Firm* — ArentFox Schiff LLP

(57) ABSTRACT

A nanoparticle is specified. The nanoparticle comprises a nanocrystal configured to convert electromagnetic radiation of a first wavelength range into electromagnetic radiation of a second wavelength range, a first encapsulation comprising pores which reach into or through the first encapsulation, and a second encapsulation which is different from the first encapsulation, wherein the second encapsulation abuts at least one of the pores. Furthermore, a structure comprising a plurality of nanoparticles and a method for producing nanoparticle is specified.

16 Claims, 6 Drawing Sheets

NANOPARTICLE, STRUCTURE, AND METHOD FOR PRODUCING A NANOPARTICLE

TECHNICAL FIELD

A nanoparticle, a structure and a method for producing a nanoparticle are specified.

SUMMARY

It is an object to provide a nanoparticle with improved efficiency and stability. In particular, a nanoparticle with an increased reliability shall be provided. It is further an object to provide a structure with improved efficiency and stability. In particular, a structure with improved luminescence properties shall be provided. Another object is to provide a simple and efficient method for producing a nanoparticle said nanoparticle having an improved efficiency and stability.

A nanoparticle is specified. The nanoparticle is in particular discrete. In other words, the nanoparticle may comprise a defined structure. Further, the nanoparticle may be separable from other nanoparticles of the same kind. In particular, the nanoparticle is not covalently bound to the other nanoparticles of the same kind. Also, a diameter, for example a maximum extent, may by assigned to each nanoparticle.

According to at least one embodiment of the nanoparticle, the nanoparticle comprises a nanocrystal configured to convert electromagnetic radiation of a first wavelength range into electromagnetic radiation of a second wavelength range. In particular, the nanocrystal absorbs the electromagnetic radiation of the first wavelength range, converts the electromagnetic radiation of the first wavelength range into the electromagnetic radiation of the second wavelength range, and reemits the electromagnetic radiation of the second wavelength range. In other words, the nanocrystal has wavelength converting properties.

Preferably, the second wavelength range is at least partially, particularly preferably completely different from the first wavelength range. For example, the second wavelength range comprises wavelengths having greater values compared to wavelengths in the first wavelength range. In other words, the second wavelength range can comprise wavelengths having a lower energy compared to the wavelengths of the first wavelength range. For example, the first wavelength range is in the UV to blue region of the electromagnetic spectrum. The second wavelength range can be in the visible region to IR region of the electromagnetic spectrum.

In particular, a nanocrystal is a particle having a diameter of 1 nanometer up to 100 nanometers, preferably of 2 nanometers to 20 nanometers, both inclusive. Diameter means here and in the following a maximum extent. A nanocrystal or other structure that are not spherically shaped can also have a diameter. Due to their size, nanocrystals consisting of a distinct materials have different properties than a bulk material consisting of the same material. For example, the nanocrystal and the bulk material differ in properties such as optical properties, conductivity, and melting point. The nanocrystal may be spherical, rod-shaped, or cuboid. A surface of the nanocrystal can be uniform or uneven. For example, the nanocrystal is a quantum dot.

The nanocrystal preferably comprises or consists of at least one semiconductor material, for example a III-V compound semiconductor material and/or a II-VI compound semiconductor material.

A III-V compound semiconductor material comprises at least one element of group 13 of the periodic table, for example B, Al, Ga, In, and at least one element of group 15 of the periodic table, for example N, P, As. A II-VI compound semiconductor material comprises at least one element of group 2 or 12 of the periodic table, for example Zn, Cd, Mg, and at least one element of group 16 of the periodic table, for example O, S, Se, Te.

Preferably, the nanocrystal comprises or consists of a sulfide and/or a selenide.

The nanocrystal may comprise a core and at least one shell surrounding the core. For example, the core and/or the shell comprises or consists of a semiconductor material as described above. In particular, the core and the shell comprise or consist of different semiconductor materials.

Preferably, the at least one shell is epitaxially grown onto the core. Particularly preferably, the nanocrystal comprises a quantum well structure. For example, the nanocrystal is a core-shell quantum dot or a core-shell-shell quantum dot. For example, the nanocrystal is a core-shell-shell quantum dot comprising CdSe, CdS, and ZnS.

According to at least one embodiment of the nanoparticle, the nanoparticle comprises a first encapsulation. In particular, the first encapsulation surrounds the nanocrystal at least in places. Preferably, the first encapsulation covers a surface of the nanocrystal at least partially. The first encapsulation may not be in direct contact with the nanocrystal. Alternatively, the first encapsulation can be in direct contact with the nanocrystal.

According to at least one embodiment of the nanoparticle, the first encapsulation comprises pores which reach into or through the first encapsulation. In other words, the first encapsulation can be porous. Preferably, the pores are channels and/or cavities inside and/or at a surface of the first encapsulation. The pore can have a beginning and an end. For example, the pore reaches from the surface of the first encapsulation through the first encapsulation to the surface of the nanocrystal. In this case, the pore is a channel through the first encapsulation.

Deleterious species such as oxygen and water can reach the surface of the nanocrystal through the pores. As a result, it is possible that the nanocrystal degrades and is thus no longer able to convert the electromagnetic radiation of the first wavelength range into the electromagnetic radiation of the second wavelength range.

According to at least one embodiment of the nanoparticle, the nanoparticle comprises a second encapsulation. The second encapsulation may be different from the first encapsulation. In particular, the first encapsulation and the second encapsulation differ in their structure and/or their composition. Preferably, the first encapsulation and the second encapsulation comprise or consist of at least partially, particularly preferably completely different materials. It is possible, that the nanoparticle only comprises the second encapsulation. In particular, the second encapsulation is in direct contact with the nanocrystal. Alternatively, other elements, such as the first encapsulation, may be arranged between the nanocrystal and the second encapsulation.

According to at least one embodiment of the nanoparticle, the second encapsulation abuts at least one of the pores. In other words, the second encapsulation is at least the adjacent to one of the pores in the first encapsulation. In particular, the second encapsulation covers the beginning and/or the end of one of the pores at least partially, preferably completely. The encapsulation can close at least some of the pores in this way.

As the second encapsulation abuts at least one of the pores, the second encapsulation can prevent deleterious species to reach the surface of the nanocrystal. Thus, the degradation of the nanocrystal is prevented by the second encapsulation. As a result, the nanoparticle has increased reliability and/or longevity as it has an increased chemical stability.

According to a preferred embodiment of the nanoparticle, the nanoparticle comprises a nanocrystal configured to convert electromagnetic radiation of a first wavelength range into electromagnetic radiation of a second wavelength range, a first encapsulation comprising pores of which reach into or through the first encapsulation, and a second encapsulation which is different from the first encapsulation, wherein the second encapsulation abuts at least one of the pores. The first encapsulation and/or the second encapsulation can be formed as a layer.

A nanoparticle of a different kind may comprise a nanocrystal and an encapsulation. In particular, the nanoparticle of the different kind only comprises an encapsulation in form of a thick layer of ZnS. In an application of this nanoparticle in an optoelectronic device, the nanoparticle of the different kind surrounded by a thick layer of ZnS shows improved longevity. However, the thick layer of ZnS results in a reduction of the optical figures of merit such as an emission linewidth. This effect may be explained by the intricacies of high-temperature epitaxial growth of the ZnS.

Furthermore, a nanoparticle of a different kind may only comprise an encapsulation in form of a silica shell. The silica shell is in particular not reliable as the silica is porous. Additionally, the silica obtained, for example, by a sol-gel process cannot be annealed to make a dense glass as the nanocrystal in this nanoparticle has a reduced stability under increased temperatures.

By employing the first encapsulation and the second encapsulation, the shortcomings of such nanoparticles are addressed and the stability against external influences, such as deleterious species, is increased in the nanoparticle described herein compared to other nanoparticles. In this way, a nanoparticle with an increased reliability can be provided.

According to at least one embodiment of the nanoparticle, the second encapsulation at least partially, preferably completely fills the pores. In this way, deleterious species are prevented from reaching and degrading the nanocrystal. Thus, the reliability of the nanoparticle is increased by the second encapsulation at least partially filling the pores.

According to at least one embodiment of the nanoparticle, the first encapsulation comprises or consists of an oxide. In particular, the first encapsulation comprises or consists of a metal oxide. Preferably, the first encapsulation comprises or consists of at least one material selected from the group consisting of silica ($SiO_2$), alumina ($Al_2O_3$), titania ($TiO_2$), zirconia ($ZrO_2$), and combinations thereof. For example, the encapsulation comprises or consists of silica.

Advantageously, the first encapsulation comprising an oxide ensures that the nanocrystal is at least partially chemically and mechanically protected from external influences.

According to at least one embodiment of the nanoparticle, the second encapsulation comprises or consists of a material selected from the group of semiconductor materials, silicates, hydroxysilicates, fluorosilicates, and combinations thereof. Preferably, these compounds are chemically stable. However, it is also possible that the material of the second encapsulation reacts with deleterious species. Particularly preferably, the material of the second encapsulation is able to abut at least one of the pores in the first encapsulation.

Thus, deleterious species are prevented from reaching and degrading the nanocrystal. In this way, advantageously, the efficiency of the nanocrystal is maintained even under chemical stress.

In particular, the semiconductor material is a III-V compound semiconductor material or a II-VI compound semiconductor material. Preferably, the semiconductor material is a wide band-gap semiconductor, for example comprising or consisting of a metal chalcogenide or a pnictogen. For example, the semiconductor material is ZnS, ZnSe, GaP, or AlP. The semiconductor material of the second encapsulation can be the same as one of the semiconductor materials of the nanocrystal.

Advantageously, the semiconductor material is not only able to act as a physical barrier for the deleterious species but also as a sacrificial reagent. In this context, the sacrificial reagent is a compound which reacts with the deleterious species and thus prevents the deleterious species from reaching and degrading the nanocrystal.

The silicates, hydroxysilicates, and fluorosilicates may be based on Al, Ti, Zn, and combinations thereof. For example, the second encapsulation comprises or consists of zinc silicate ($Zn_2SiO_4$).

According to at least one embodiment of the nanoparticle, the first encapsulation comprises a plurality of layers. In Particular, the first encapsulation comprises at least three layers. Advantageously, the plurality of layers ensure an efficient protection of the nanocrystal from external influences. One layer of the first encapsulation may be, in particular directly, adjacent to another layer of the first encapsulation. Additionally or alternatively, it is possible that a different layer, for example comprising the second encapsulation, is arranged between two layers of the first encapsulation.

According to at least one embodiment of the nanoparticle, the second encapsulation comprises plurality of layers. Alternatively, it is possible that the second encapsulation comprises or consists of only one layer. In particular, at least one layer of the first encapsulation is at least partially surrounded by at least one layer of the second encapsulation. Additionally or alternatively, at least one layer of the second encapsulation is at least partially surrounded by at least one layer of the first encapsulation. For example, one layer of the second encapsulation is at least partially surrounded by a plurality of layers of the first encapsulation.

According to at least one embodiment of the nanoparticle, the layers of the first encapsulation and the layers of the second encapsulation are arranged in an alternating manner. In other words, a layer of the first encapsulation is at least partially surrounded by a layer of the second encapsulation and the layer of the second encapsulation may be at least partially surrounded by a further layer of the first encapsulation.

By arranging the layers of the first encapsulation and the layers of the second encapsulation in an alternating manner, the pores of the first encapsulation can be efficiently covered and/or filled. In this way, it is possible to prevent deleterious species such as water and oxygen reaching the nanocrystal and thus inducing the degradation of the nanocrystal which can lead to a reduction of the wavelength converting properties of the nanocrystal.

According to at least one embodiment of the nanoparticle, the first encapsulation and the second encapsulation form a heteromixture. "Heteromixture" in this context means that, for example, the first encapsulation and the second encapsulation are homogeneously or heterogeneously mixed, in particular in a layer. The nanoparticle may comprise at least one layer, preferably a plurality of layers of the heteromixture formed by the first encapsulation and the second encapsulation. In other words, the nanocrystal can be at least partially surrounded by at least one layer, preferably a plurality of layers comprising the first encapsulation and the second encapsulation together.

In particular, the heteromixture comprises or consists of phases of the first encapsulation and phases of the second encapsulation. Preferably, the heteromixture comprises or consists of a plurality of particles, for examples crystallites, of the first encapsulation and a plurality of particles, for examples crystallites, of the second encapsulation. For example, the heteromixture of the first encapsulation and the second encapsulation is formed if the first encapsulation and the second encapsulation are formed at the same time around the nanocrystal.

In particular, the heteromixture comprises properties of the first encapsulation and the second encapsulation. Preferably, in this way the nanocrystal is at least partially surrounded by a material which does not comprise pores reaching through the material to the nanocrystal. Advantageously, the nanocrystal can thus be prevented from degradation, for example by deleterious species.

According to at least one embodiment of the nanoparticle, a photoluminescence quantum yield (PLQY) of the nanoparticle is at least 85%. The PLQY of a material, such as the nanoparticle is defined as the number of photons emitted by the material as a fraction of the number of photons absorbed by the material. In particular, a high PLQY relates to an efficient luminescence conversion material. Advantageously, the nanoparticle with the PLQY of at least 85% can efficiently convert the electromagnetic radiation of the first wavelength range into the electromagnetic radiation of the second wavelength range.

According to at least one embodiment of the nanoparticle, the nanoparticle emits electromagnetic radiation of the second wavelength range with a full-width at half maximum of at most 35 nanometers.

Furthermore, a structure is specified. According to at least one embodiment of the structure, the structure comprises a plurality of nanoparticles. In particular, the nanoparticle has features as described herein. Thus, all features and embodiments disclosed in conjunction with the nanoparticle also apply to the structure and vice versa. For example, the structure comprises a plurality of first nanoparticles as described herein and a plurality of second nanoparticles as described herein, wherein the first nanoparticles and the second nanoparticles comprise a different structure and/or composition. Alternatively, the structure may only comprise a plurality of nanoparticles of one type.

According to at least one embodiment of the structure, the nanoparticles form an aggregate or agglomerate.

In particular, an aggregate is formed by the plurality of nanoparticles by aggregation. Preferably, the aggregate has the structure of a cluster. In particular, aggregating does not necessarily mean that the nanoparticles are bound together by covalent bonds and/or coordinative bonds.

In particular, an agglomerate comprises a plurality of nanoparticles agglomerated with each other by covalent bonds and/or coordinative bonds. Preferably, the nanoparticles in the agglomerate are bound together by covalent bonds. For example, the first encapsulation and/or the second encapsulation of two adjacent nanoparticles in the agglomerate are covalently bound together.

Advantageously, the agglomerate or the aggregate is more stable with regards to thermal, mechanical and chemical stress compared to a single nanoparticle. Thus, the structure shows an increased reliability. Furthermore, conversion properties of the agglomerate or the aggregate may be improved compared to a single nanoparticle. This can be explained as the nanoparticles in the agglomerate or the aggregate interact with each other.

According to at least one embodiment of the structure, the structure comprises a diameter of 0.5 micrometers to 10 micrometers, both inclusive. The diameter of the structure can be at least 1 micrometer. Preferably, the diameter of the structure is 5 micrometers to 10 micrometers, both inclusive. Due to its size, the structure is easier to handle compared to single nanoparticle. In particular, the structure is easier to separate from other particles or chemical compounds due to the size.

According to at least one embodiment of the structure, the structure comprises a further encapsulation. In particular, the further encapsulation at least partially, preferably completely surrounds the plurality of nanoparticles in the aggregate or agglomerate. Advantageously, the further encapsulation protects the nanoparticles from external influences, such as mechanical or chemical stress.

According to at least one embodiment of the structure, the further encapsulation comprises or consists of a material selected from the group consisting of: semiconductor materials, oxides, and combinations thereof. The semiconductor material can have a composition as previously described. For example, the semiconductor material is a II-VI compound semiconductor material, preferably ZnS. The oxide is, in particular, a metal oxide, such as silica, alumina, titania, zirconia, and combinations thereof.

According to at least one embodiment of the structure, a photoluminescence quantum yield (PLQY) of the structure is at least 85%. In other words, the structure is efficient with regards to a conversion of electromagnetic radiation of a first wavelength range into electromagnetic radiation of a second wavelength range.

Furthermore, a method for producing a nanoparticle is specified. In particular, the method can be used to produce a nanoparticle as described herein. Thus, features and embodiments described in conjunction with the nanoparticle also apply to the method for producing a nanoparticle and vice versa.

According to at least one embodiment of the method for producing a nanoparticle, a nanocrystal is provided. The nanocrystal is configured to convert electromagnetic radiation of a first wavelength range into electromagnetic radiation of a second wavelength range. Preferably, the nanocrystal has features as described herein. Thus, the described features also apply to the nanocrystal in the method.

According to at least one embodiment of the method for producing a nanoparticle, a first encapsulation is formed, preferably around the nanocrystal. In particular, the first encapsulation comprises pores which reach into a through the first encapsulation. Preferably, the first encapsulation has features as described herein. Thus, the described features also apply to the first encapsulation in the method.

The first encapsulation is in particular formed by treating the nanocrystal with a precursor of the first encapsulation. The precursor is for example a corresponding metal alkoxide. Preferably, forming the first encapsulation comprises treating with at least one of a silica precursor, a titania precursor, an alumina precursor, and combinations thereof. For example, forming the first encapsulation comprises treating with tetraethyl orthosilicate (TEOS).

According to at least one embodiment of a method for producing a nanoparticle, a second encapsulation is formed. The second encapsulation is different from the first encapsulation. In particular, the second encapsulation abuts at least one of the pores. Preferably, the second encapsulation has features as described herein. Thus, the described features also apply to the second encapsulation in the method.

In particular, reaction conditions under which the second encapsulation is formed define a structure of the second encapsulation. A fast reaction during forming the second encapsulation preferably leads to a second encapsulation which is formed as a layer and wherein the second encapsulation abuts at least one of the pores of the first encapsulation. A slow reaction during forming the second encapsulation can cause the second encapsulation to at least partially, preferably completely fill the pores of the first encapsulation. For example, highly reactive precursors of the second encapsulation lead to the fast reaction. A slow precursor that reacts slower than a relevant diffusion time may lead to the slow reaction.

According to a preferred embodiment, the method for producing a nanoparticle comprises the following method steps:
 providing a nanocrystal configured to convert electromagnetic radiation of a first wavelength range into electromagnetic radiation of a second wavelength range,
 forming a first encapsulation comprising pores which reach into or through the first encapsulation,
 forming a second encapsulation which is different from the first encapsulation, wherein the second encapsulation abuts at least one of the pores.

By forming the second encapsulation, the pores in the first encapsulation can be at least partially, preferably completely covered or filled. In this way, a physical barrier for deleterious species can be provided.

According to at least one embodiment of the method, the second encapsulation comprises a semiconductor material and the semiconductor material is formed by chemical bath deposition or successive ionic layer adsorption.

During the chemical bath deposition, a substrate such as the nanocrystal or the nanocrystal with the first encapsulation is in particular provided in a solution. The solution can further contain reactants and reagents to form the second encapsulation. Preferably, thin layers can be deposited by the chemical bath deposition. Advantageously, the chemical bath deposition leads to an even formation of the second encapsulation. Furthermore, the chemical bath deposition can be easily performed and does not require complex equipment, for example compared to chemical vapor deposition (CVD) wherein a vacuum system is needed.

During the successive ionic layer absorption, a substrate such as the nanocrystal or the nanocrystal with the first encapsulation is in particular treated with a cationic precursor of the second encapsulation. The substrate can be washed such that an excess of the cationic precursor is removed. The substrate with the cationic precursor is preferably subsequently treated with an anionic precursor of the second encapsulation such that the second encapsulation is formed.

For example, a second encapsulation comprising ZnS is formed by chemical bath deposition. Thereby, a $Zn^{2+}$ source, such as zinc acetate ($Zn(OAc)_2$) and a $S^{2-}$ source, such as a sulfide or a thioamide, like thioacetamide or thiourea, are provided as reactants. A polar solvent, for example an alcohol, such as methanol, ethanol, 1-butanol or mixtures thereof, may be used as the solvent for chemical bath deposition. It is further possible to use an additive, such as 4-amino-1-butanol, for example to increase a solubility of zinc acetate.

According to at least one embodiment of the method, the second encapsulation comprises a material selected from the group comprising silicates, hydroxysilicates, fluorosilicates, and combinations thereof. In particular, the material is formed by applying a metal and subsequent oxidation, for example under ambient conditions. Preferably, the metal is applied by electroless deposition or as a metal nanoparticle. Particularly preferably, the metal is applied inside or at least adjacent to the pores of the first encapsulation such that the second encapsulation abuts and/or at least partially fills the pores after forming the second encapsulation. In other words, the first encapsulation is densified by forming the second encapsulation.

In particular, during electroless deposition the nanocrystal with or without the first encapsulation is treated with a metal cation of the metal to be applied and a reducing agent. For example, $Zn^{2+}$ is used as the metal cation. The $Zn^{2+}$ may be provided by zinc acetate. Preferably, the reducing agent is able to reduce the metal cation such that the metal is formed. Particularly preferably, the metal is applied by electroless deposition from an aqueous solution or a non-aqueous solution.

In particular, applying the metal as the metal nanoparticle is performed during forming the first encapsulation. Preferably, the nanocrystal is treated at the same time with the precursor of the first encapsulation and with the metal nanoparticle.

For example, a second encapsulation comprising zinc is formed by electroless deposition of zinc or applying zinc nanoparticles and subsequent oxidation. In particular, zinc silicate ($Zn_2SiO_4$) is formed if the first encapsulation comprises or consists of silica.

According to at least one embodiment of the method, the first encapsulation and the second encapsulation are formed at the same time. In this way, the first encapsulation and the second encapsulation can form a heteromixture. In particular, the nanocrystal is treated at the same time with the reactants and reagents to form the first encapsulation and with the reactants and reagents to form the second encapsulation.

According to at least one embodiment of the method, forming the first encapsulation and/or forming the second encapsulation are repeated at least once. In particular, in this way a plurality of layers of the first encapsulation and a plurality of layers of the second encapsulation can be formed. Preferably, forming the first encapsulation and forming the second encapsulation are not performed at the same time such that an alternating layers of the first encapsulation and the second encapsulation are formed.

According to at least one embodiment of the method, forming the first encapsulation is performed before forming the second encapsulation. Additionally or alternatively, forming the second encapsulation is performed before forming the first encapsulation. In this way, a nanoparticle is formed wherein a nanocrystal is first at least partially surrounded by the first encapsulation or the second encapsulation. Furthermore, layers of the first encapsulation and/or the second encapsulation are formed around the first encapsulation or the second encapsulation.

According to at least one embodiment of the method, the method further comprises treating with a base. In particular, treating with a base is performed after forming the first encapsulation. Preferably, treating with a base changes a structure of the first encapsulation. Particularly preferably, the first encapsulation comprises less pores after treating with a base.

According to at least one embodiment of the method, forming the second encapsulation comprises:
- treating with a first precursor, such as the metal cation during electroless deposition or the cationic precursor during successive ionic layer adsorption,
- treating with a second precursor, such as the reducing agent during electroless deposition or the anionic precursor during successive ionic layer adsorption.

In particular, treating with a second precursor is performed in an absence of the first precursor. The described method may lead to partial leeching of the first precursor out of the first encapsulation. In this way, it is possible to create gradients of the second encapsulation inside the first encapsulation.

For example, zinc acetate is used as the first precursor. Additionally or alternatively, thioacetamide can be used as the second precursor.

Further a method for producing a structure is specified. In particular, the method can be used to produce a structure as described herein. Thus, features and embodiments described in conjunction with the structure also apply to the method for producing a structure and vice versa.

According to at least one embodiment of the method for producing a structure, a plurality of nanoparticles are provided. Preferably, the nanoparticles have features as described herein. Thus, the described features also apply to the nanoparticles in the structure. The plurality of nanoparticles may comprise at least two different types of nanoparticles, preferably as described herein.

According to at least one embodiment of the method for producing a structure, the plurality of nanoparticles is agglomerated or aggregated to form the structure. In particular, the plurality of nanoparticles is agglomerated or aggregated by at least one of adding an anti-solvent, adding a salt, removing the solvent, and combinations thereof.

According to at least one embodiment of the method for producing a structure, the method comprises forming a further encapsulation around the agglomerate or aggregate. The further encapsulation may comprise or consist of the same or a similar material as the encapsulation of the nanoparticles within the agglomerate or the aggregate. Thus, features and embodiments described in conjunction with the encapsulation and forming the encapsulation in the nanoparticle also apply to the further encapsulation around the agglomerate or the aggregate.

Furthermore, an optoelectronic device is specified. In particular, the optoelectronic device comprises a nanoparticle and/or a structure as described herein. Thus features and embodiments disclosed in combination with the nanoparticle and the structure can also apply to the optoelectronic device and vice versa.

According to an embodiment, the optoelectronic device comprises a semiconductor chip. The semiconductor chip comprises an epitaxially grown semiconductor layer sequence configured to emit electromagnetic radiation of a first wavelength range. For example, the first wavelength range is the UV to blue wavelength range of the visible electromagnetic radiation. For example, the semiconductor chip is a light emitting diode chip or a laser diode chip.

In particular, the semiconductor layer sequence comprises an active region that emits the electromagnetic radiation of the first wavelength range. The electromagnetic radiation of the first wavelength range is preferably emitted through a radiation exit surface of the semiconductor chip.

According to an embodiment, the optoelectronic device comprises a conversion layer. Preferably, the conversion layer comprises at least one, preferably a plurality of nanoparticles or at least one, preferably a plurality of structures as described herein. In particular, the conversion element is designed or configured to convert the electromagnetic radiation of the first wavelength range into electromagnetic radiation of a second wavelength range. Preferably, the second wavelength range is at least partially, preferably completely, different from the first wavelength range. For example, the second wavelength range is in the visible or IR region of the electromagnetic spectrum.

The features and embodiments of the nanoparticle and the structure have already been disclosed in conjunction with the nanoparticle and the structure and also apply to the nanoparticles and structures in the optoelectronic device.

For example, the optoelectronic device described herein emits white light or colored light. The nanoparticles and the structures in the conversion element show an increased reliability and stability against deleterious species such as water or oxygen as they comprise the first encapsulation and the second encapsulation. Thus, the optoelectronic device described herein has an increased reliability and efficiency.

Advantageous embodiments and developments of the nanoparticle, the structure, the optoelectronic device, and the methods for producing a nanoparticle and a structure will become apparent from the exemplary embodiments described below in conjunction with the figures.

DETAILED DESCRIPTION

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

Figure 1:
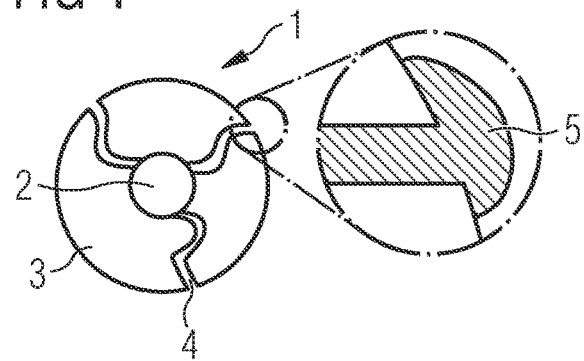
FIGS. 1 to 6 show schematic sectional views of nanoparticles according to an exemplary embodiment.

In FIG. 1, a schematic sectional view of a nanoparticle 1 according to an exemplary embodiment is shown. The nanoparticle 1 comprises a nanocrystal 2. The nanocrystal 2 is configured to convert electromagnetic radiation of a first wavelength range into electromagnetic radiation of a second wavelength range. The nanocrystal 2 is a core-shell-shell quantum dot comprising a core with CdSe, a shell with CdS, and a shell with ZnS.

The nanoparticle 1 shown in FIG. 1 further comprises a first encapsulation 3. The first encapsulation 3 at least partially surrounds the nanocrystal 2 at least in places. The first encapsulation 3 is in particular in direct contact with the nanocrystal 2. Furthermore, the first encapsulation comprises or consists of a metal oxide, for example silica.

Pores 4 reach into or through the first encapsulation 3. Presently, at least one pore 4 is configured as a channel reaching through the first encapsulation 3. In particular, the pore 4 has a beginning at a surface of the first encapsulation 3. The pore 4 may also have an end at a surface of the nanocrystal 2. If the pore 4 is not filled or covered, deleterious species such as water and oxygen can reach the nanocrystal 2 and lead to a degradation of the nanocrystal 2. As a result of the degradation, the nanocrystal 2 may lose its wavelength conversion properties.

The nanoparticle 1 further comprises a second encapsulation 5. The second encapsulation abuts at least one of the pores 4. This is shown in the magnification shown in FIG. 1. The second encapsulation 5 presently comprises a semiconductor material such as ZnS. In other words, the second encapsulation 3 is different from the second encapsulation 5. The second encapsulation 5 covers and at least partially fills at least one of the pores 4. In this way, deleterious species are prevented from reaching and thus degrading the nanocrystal 2.

The nanoparticle 1 described in combination with FIG. 1 comprises a photoluminescence quantum yield greater or equal to 85%.

Figure 2:
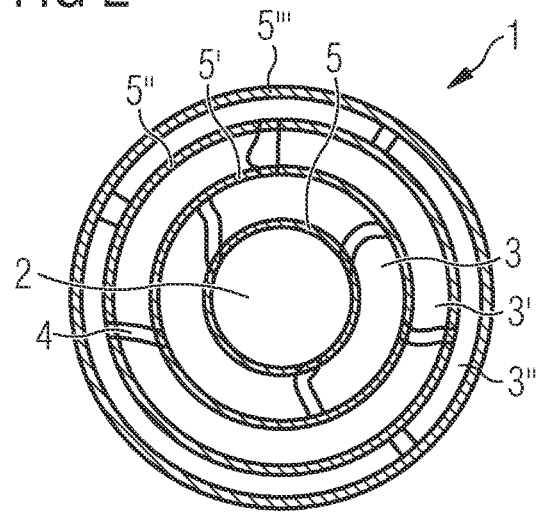

The nanoparticle 1 shown in FIG. 2 comprises a nanocrystal 2 configured to convert electromagnetic radiation of a first wavelength range into electromagnetic radiation of a second wavelength range. The nanocrystal 2 comprises a semiconductor material such as CdSe.

The nanoparticle 1 further comprises a first encapsulation 3, 3',3" at least partially surrounding the nanocrystal 2. Pores 4 reach into or through the first encapsulation 3, 3',3". Presently, the first encapsulation comprises three layers 3, 3',3" and preferably comprises silica.

The nanoparticle 1 presently also comprises a second encapsulation 5, 5',5",5'". The second encapsulation 5, 5', 5", 5'" abuts at least one of the pores 4 in the first encapsulation 3, 3', 3". The second encapsulation comprises four layers 5, 5', 5", 5'". The layers 3, 3', 3" of the first encapsulation and the layers 5, 5', 5", 5'" of the second encapsulation are arranged in an alternating manner. The second encapsulation layer 5 directly at least partially surrounds the nanocrystal 2. In other words, no first encapsulation 3 is arranged between the nanocrystal 2 and the second encapsulation 5. An outermost layer of the nanoparticle 1 is the second encapsulation layer 5'".

Preferably, the second encapsulation 5, 5', 5", 5'" comprises a semiconductor material such as ZnS. The layers 5, 5', 5", 5'" can differ in their composition and/or structure. For example, the layer 5 comprises a different semiconductor material than the layer 5'.

Figure 3:
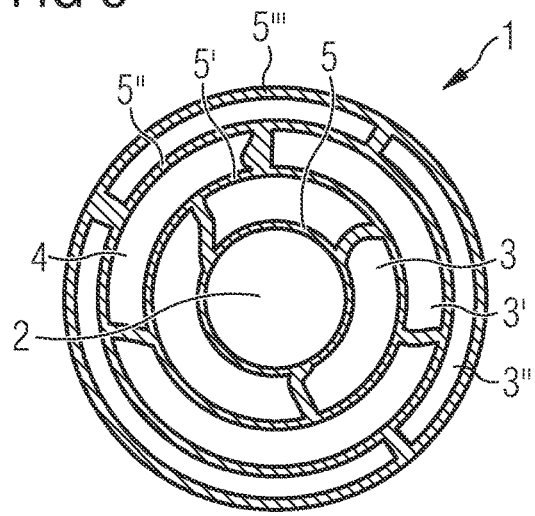

The exemplary embodiment of a nanoparticle 1 shown in FIG. 3 comprises a similar structure and composition as described for the nanoparticle 1 shown in FIG. 2. The second encapsulation 5, 5', 5", 5'" abuts at least one of the pores 4 in the first encapsulation 3, 3', 3". Furthermore, the pores 4 are at least partially filled by the second encapsulation 5, 5', 5", 5'".

Figure 4:
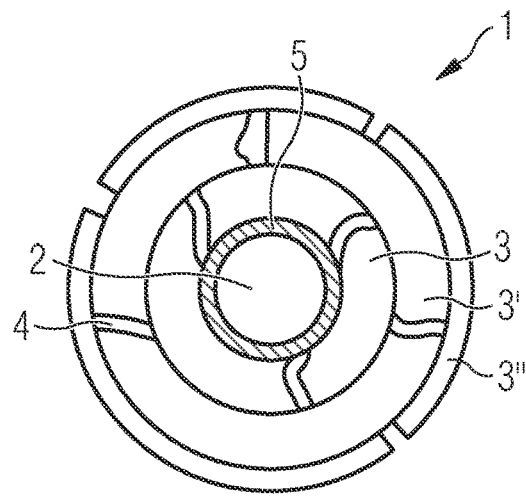

The nanoparticle 1 of FIG. 4 comprises a nanocrystal 2 with a structure as described in conjunction with FIG. 1. The nanocrystal 2 is at least partially surrounded by a second encapsulation 5. Presently, the second encapsulation 5 comprises ZnS. No additional layer is arranged between the nanocrystal 2 and the second encapsulation 5. A total amount of ZnS on the nanocrystal 2 is in excess of five times the weight of an inorganic material of the nanocrystal 2.

The nanoparticle 1 further comprises a first encapsulation 3, 3', 3" which consists of three layers. The first encapsulation 3, 3', 3" comprises or consists of silica. The first encapsulation further comprises pores 4 which reach into or through the first encapsulation 3, 3', 3". The second encapsulation 5 abuts at least one of the pores 4 of layer of the first encapsulation 3 which is adjacent to the second encapsulation 5.

In particular, an electromagnetic radiation which is emitted by the nanoparticle 1 presently comprises a full-width at half maximum of below 35 nanometers.

Figure 5:
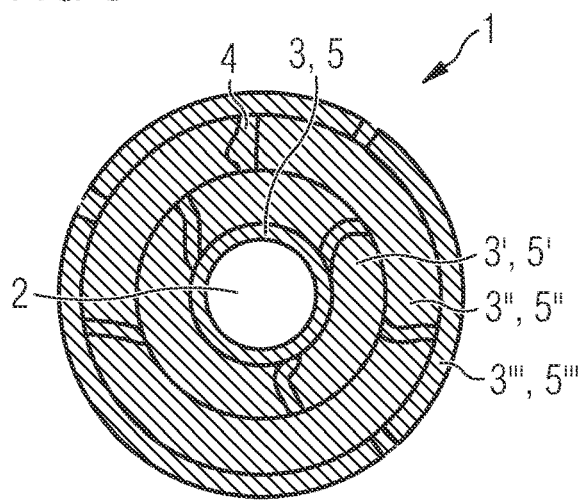

FIG. 5 shows an exemplary embodiment of a nanoparticle 1. The nanoparticle 1 comprises a nanocrystal 2 configured to convert electromagnetic radiation of a first wavelength range into electromagnetic radiation of a second wavelength range. The nanoparticle 1 further comprises a heteromixture comprising the first encapsulation 3, 3', 3", 3'" and the second encapsulation 5, 5', 5", 5'". The first encapsulation 3, 3', 3", 3'" comprises or consists of silica, the second encapsulation 5, 5', 5", 5'" comprises or consists of ZnS.

The nanocrystal 2 is at least partially surrounded by four layer comprising the heteromixture of the first encapsulation 3, 3', 3", 3'" and the second encapsulation 5, 5', 5", 5'". The first encapsulation 3, 3', 3", 3'" comprises pores 4 which reach into or through the first encapsulation 3, 3', 3", 3'". The second encapsulation 5, 5', 5", 5'" abuts at least one of the pores 4. In that way, deleterious species are prevented from reaching the nanocrystal 2.

The heteromixture comprises particles, like crystallites of the first encapsulation and the second encapsulation. Preferably, the particles are homogeneously or heterogeneously mixed.

Figure 6:
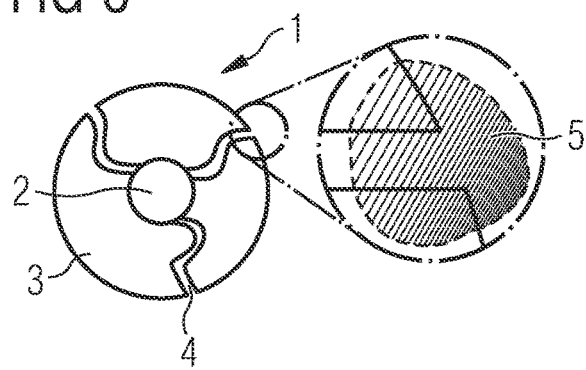

FIG. 6 shows a schematic sectional view of a nanoparticle 1 according to an exemplary embodiment. The nanoparticle 1 comprises a nanocrystal 2, a first encapsulation 3, and a second encapsulation 5. The nanocrystal 2 is a quantum dot with a core-shell-shell-structure. Presently, the first encapsulation 3 comprises or consists of a metal oxide such as silica. The second encapsulation 5 comprises or consists of a silicate, a hydroxysilicate or a fluorosilicate. For example, the second encapsulation 5 comprises or consists of zinc silicate ($Zn_2SiO_4$). The first encapsulation 3 comprises pores 4 which reach into or through the first encapsulation 2. The second encapsulation 5 abuts at least one of the pores 4. In this way, deleterious species such as water and oxygen are prevented from reaching and degrading the nanocrystal 2. Presently, the second encapsulation 5 covers and partially fills at least one of the pores 4 (see magnification). The second encapsulation 5 can be configured as a layer at least partially surrounding the first encapsulation 3 and thereby covering the pores 4.

Figure 7:
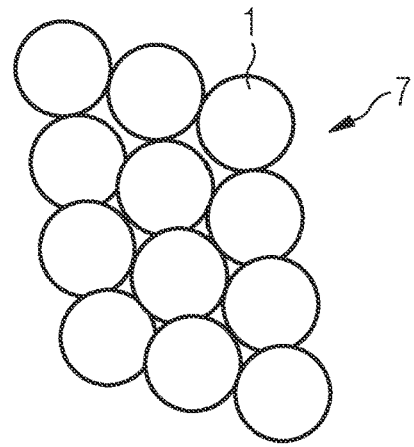
FIGS. 7 to 9 show schematic sectional views of structures according to an exemplary embodiment.

In combination with FIG. 7, an exemplary embodiment of a structure 7 is described. The structure 7 comprises a plurality of nanoparticles 1. The nanoparticles 1 can have a structure of the nanoparticles 1 described in combination with FIGS. 1 to 6. The nanoparticles 1 form an aggregate or an agglomerate. The nanoparticles 1 are in direct contact with each other. The nanoparticles 1 are presently not covalently bound to each other. The structure 7 described in combination with FIG. 7 comprises a photoluminescence quantum yield greater or equal to 85%.

Figure 8:
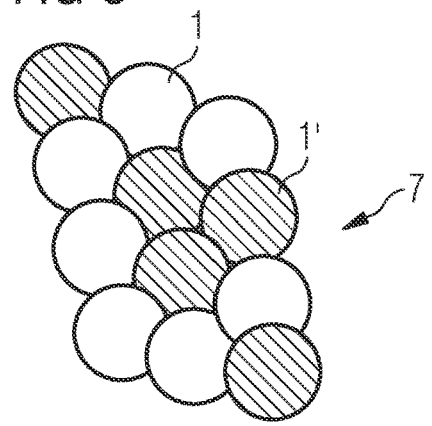

Compared to the structure 7 shown in FIG. 7, the structure 7 of FIG. 8 comprises a plurality of nanoparticles 1, 1' of two different types. The nanoparticles 1, 1' can have a structure of the nanoparticles 1 described in combination with FIGS. 1 to 6. The nanoparticle 1 of a first type has a different structure and/or composition than the nanoparticle 1' of a second type. The nanoparticles 1 of the first type and the nanoparticles 1' of the second type are homogeneously distributed in the structure 7. The nanoparticles 1, 1' form an aggregate or an agglomerate.

Figure 9:
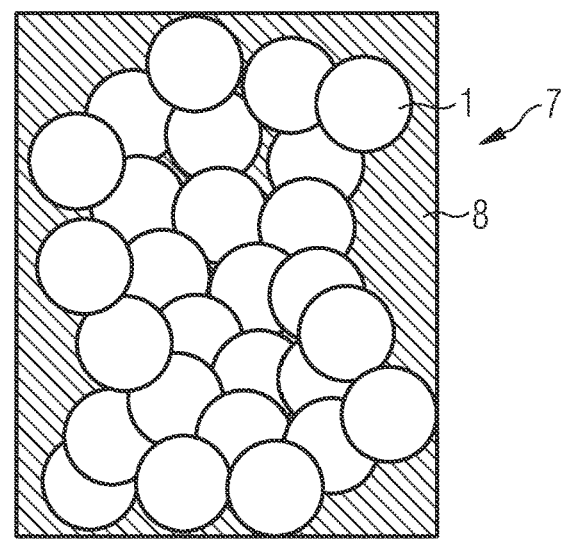

FIG. 9 shows a structure 7 with a further encapsulation 8. The structure 7 presently comprises a plurality of nanoparticles 1 which form an aggregate or an agglomerate. The nanoparticles 1 can have a structure of the nanoparticles 1 described in combination with FIGS. 1 to 6. Alternatively, the nanoparticles 1 comprise a nanocrystal 2 and a second encapsulation 5. The plurality of nanoparticles 1 is at least partially surrounded by the further encapsulation 8. The material of the further encapsulation 8 is the same as the material of the second encapsulation 5 in the nanoparticle. For example, the further encapsulation 8 and the second encapsulation 5 comprise or consist of ZnS.

Figure 10:
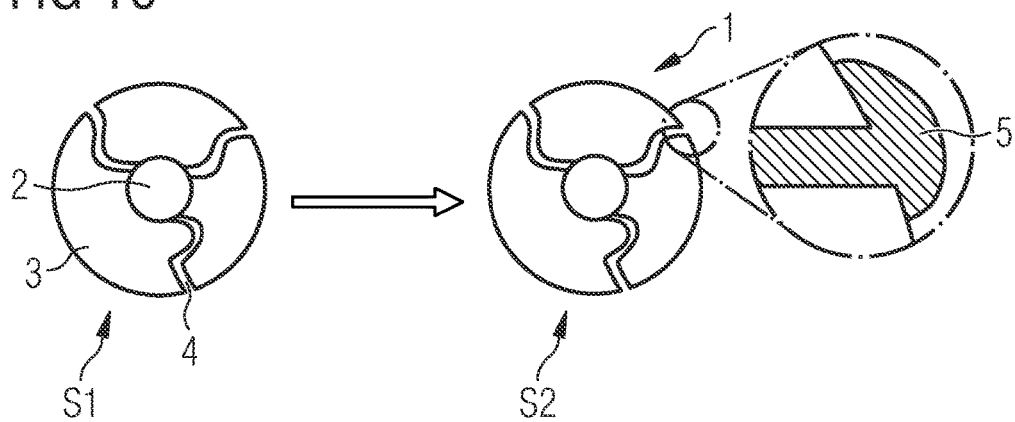
FIGS. 10 to 14 each show a method for producing a nanoparticle according to an exemplary embodiment by means of schematic sectional views.

In combination with FIG. 10 an exemplary embodiment of a method for producing a nanoparticle 1 is described. In a first step S1, a nanocrystal 2 is provided. The nanocrystal 2 has wavelength converting properties. A first encapsulation 3 is formed around the nanocrystal 2. The first encapsulation 3 is formed by treating with tetraethyl orthosilicate. The first encapsulation 3 comprises or consists of silica. Pores 4 reach into or through the first encapsulation 3.

In a second step S2, a second encapsulation 5 is formed. The second encapsulation 5 is different from the first encapsulation 3. The second encapsulation 5 abuts at least one of the pores 4. As shown in the magnification, the second encapsulation 5 covers the pore 4 and reaches at least partially into the pore 4. The second encapsulation 5 comprises or consists of a semiconductor material such as ZnS. The semiconductor material is formed by chemical bath deposition.

In the second step S2, a solution of zinc acetate dihydrate and 4-amino-1-butanol in 1-butanol is provided. The nanocrystal 2 with the first encapsulation 3 is dispersed in the solution. Thioacetamide is added and the reaction mixture is left overnight at room temperature. In this way, the second encapsulation 5 is formed. After performing the second step S2, the finished nanoparticle 1 is obtained.

The formation of the second encapsulation 5 may also be performed using different reaction conditions. In particular, for the formation of ZnS a reactant selected from the following group may be used: a $Zn^{2+}$ source, such as a Zn(II) salt, a $S^{2-}$ source, such as a sulfide or a thioamide, a catalyst, an additive, for example to increase the solubility of the $Zn^{2+}$ source, and combinations thereof. Forming of the second encapsulation 5 is, for example, performed in a polar solvent, such as an alcohol, for example methanol, ethanol, butanol, and mixtures thereof.

Figure 11:
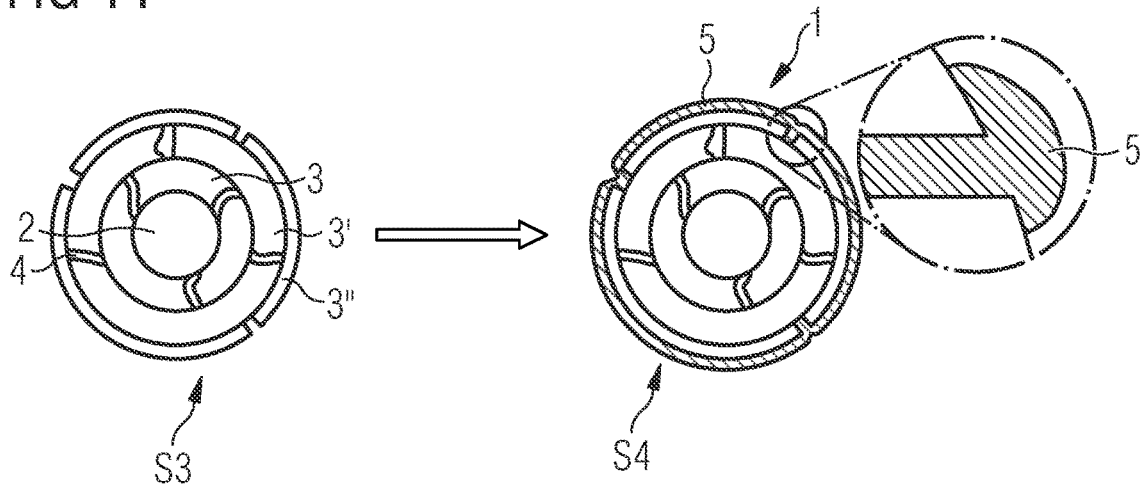

FIG. 11 shows another exemplary embodiment of a method for producing a nanoparticle 1. In a first step S3, a nanocrystal 2 is provided. Then, a first encapsulation 3, 3', 3" is formed. The first encapsulation 3, 3', 3" comprises or consists of silica. The first encapsulation 3, 3', 3" comprises pores 4 reaching into or through the first encapsulation 3, 3', 3". Presently, the first encapsulation 3, 3', 3" comprises three layers. Each layer of the first encapsulation 3, 3', 3" is formed by treating with an alkoxy silane. After forming an outermost layer 3" of the first encapsulation, the nanoparticle with the first encapsulation 3, 3', 3" is treated with a base, for example potassium hydroxide (KOH).

In a second step S4, a second encapsulation 5 is formed. The second encapsulation 5 at least partially, preferably completely surrounds the first encapsulation 3, 3', 3" in form of a layer. The second encapsulation 5 abuts at least one of the pores 4 in the first encapsulation 3, 3', 3". Presently, the second encapsulation 5 covers and partially fills the pores 4 in the outermost layer 3" of the first encapsulation. The second encapsulation 5 comprises or consists of ZnS. The second encapsulation 5 is formed by successive ionic layer absorption.

The ZnS is formed by soaking the nanocrystal 2 with the first encapsulation 3, 3', 3" in a solution of zinc acetate. The nanocrystal 2 with the first encapsulation 3, 3', 3" is afterwards redispersed in a solution comprising thioacetamide.

After forming the second encapsulation 5, the finished nanoparticle 1 is obtained.

Figure 12:
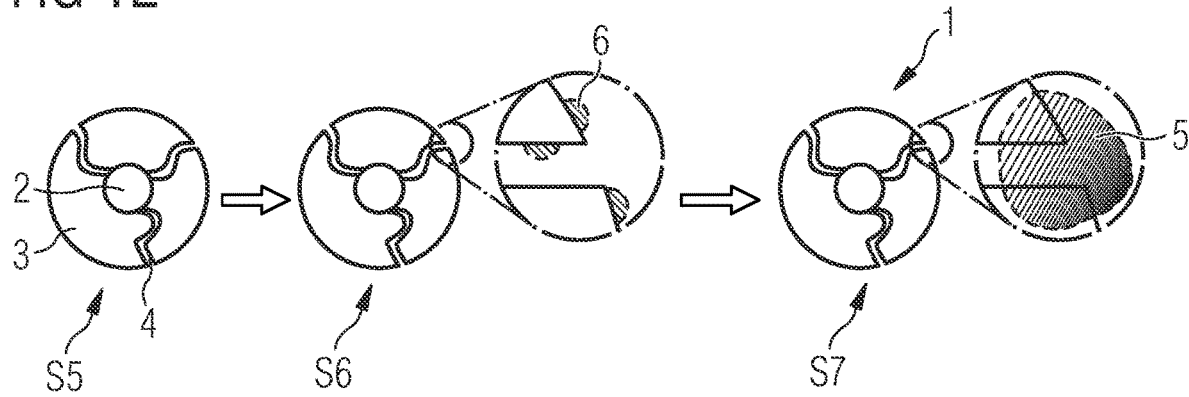

FIG. 12 describes a further exemplary embodiment of a method for producing a nanoparticle 1. The finished nanoparticle 1 obtained by the method comprises a second encapsulation 5 comprising zinc silicate.

In a first step S5, a nanocrystal 2 is provided. Then, a first encapsulation 3 is formed around the nanocrystal 2. The first encapsulation 3 comprises pores 4 which reach into of through the first encapsulation 3. The first encapsulation 3 comprises or consists of silica.

In a second step S6, a metal 6, in the present case zinc, is formed in such that the metal 6 abuts at least one of the pores 4. The metal 6 is formed by electroless deposition. Alternatively, it is possible to apply the metal 6 during forming the first encapsulation 3. This is done by treating the nanocrystal 2 simultaneously with a reagent to form the first encapsulation 3 and with nanoparticles of the metal 6. In this way, the metal 6 is incorporated into the first encapsulation 3.

In a third step S7, the metal 6 is oxidized such that the second encapsulation 5 is formed. The metal 6 reacts with an oxidizing agent, for example oxygen, and the first encapsulation 3 such that zinc silicate is formed. As the metal 6 abuts at least one of the pores 4 or is incorporated into the first encapsulation 3, the second encapsulation 5 forms a physical barrier for deleterious species, for example, by covering or at least partially filling the pores 4.

The steps of forming the first encapsulation 3 and forming the second encapsulation 5 by applying a metal 6 and oxidizing the metal 6 can be repeated such that a nanoparticle 1 is formed which comprises a plurality of layers of the first encapsulation 3 and a plurality of layers of the second encapsulation 5. In this case, the players of the first encapsulation 3 and the layers of the second encapsulation 5 are arranged in an alternating manner.

Figure 13:
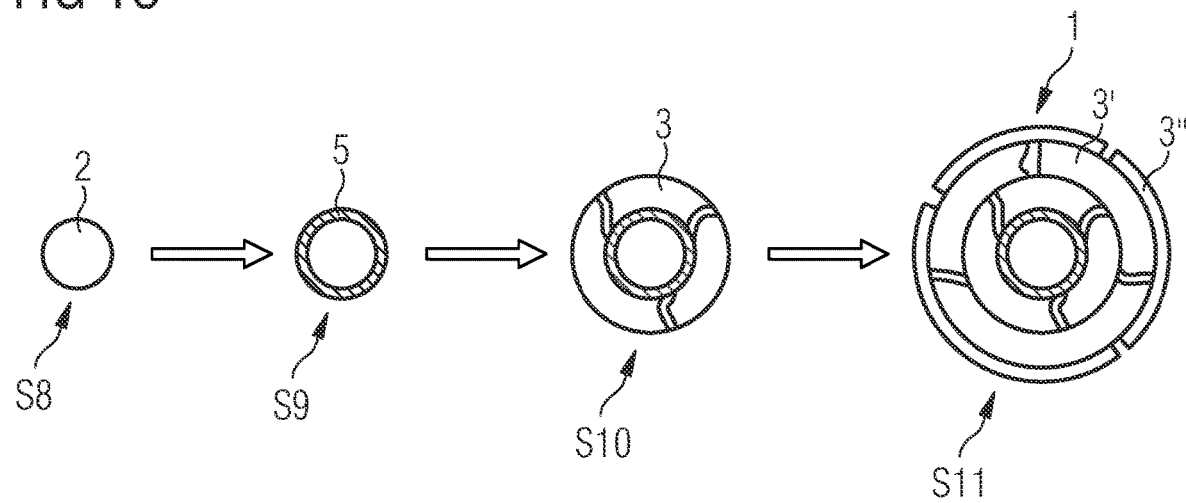

The method for producing a nanoparticle 1 described in conjunction with FIG. 13 comprises a first step S8, wherein a nanocrystal 2 is provided. The nanocrystal 2 is presently a core-shell-shell quantum dot comprising CdSe, CdS, and ZnS. The nanocrystal 2 is configured to convert electromagnetic radiation of a first wavelength range into electromagnetic radiation of a second wavelength range.

In a second step S9, a second encapsulation 5 comprising or consisting of ZnS is formed. The second encapsulation 5 is formed by chemical bath deposition. During chemical bath deposition, zinc acetate dihydrate and 4-amino-1-butanol are dissolved in 1-butanol. The nanocrystal 2 is dispersed in this solution and thioacetamide is added. After reacting at room temperature overnight, the second encapsulation 5 is formed.

In a third step S10, a first encapsulation 3 is formed around the second encapsulation 5. The first encapsulation 3 comprises silica. The first encapsulation 3 comprises pores 4 which reach into or through the first encapsulation 3. The second encapsulation 5 abuts at least one of the pores 4.

In a fourth step S11, forming the first encapsulation 3 is repeated at least once. In that way, a plurality of layers of the first encapsulation 3, 3', 3" are formed. The nanocrystal 2 at least partially surrounded by the second encapsulation 5 and the first encapsulation 3, 3', 3" is treated with a base after forming the first encapsulation 3″. After the fourth step S11, the finished nanoparticle 1 is obtained.

Figure 14:
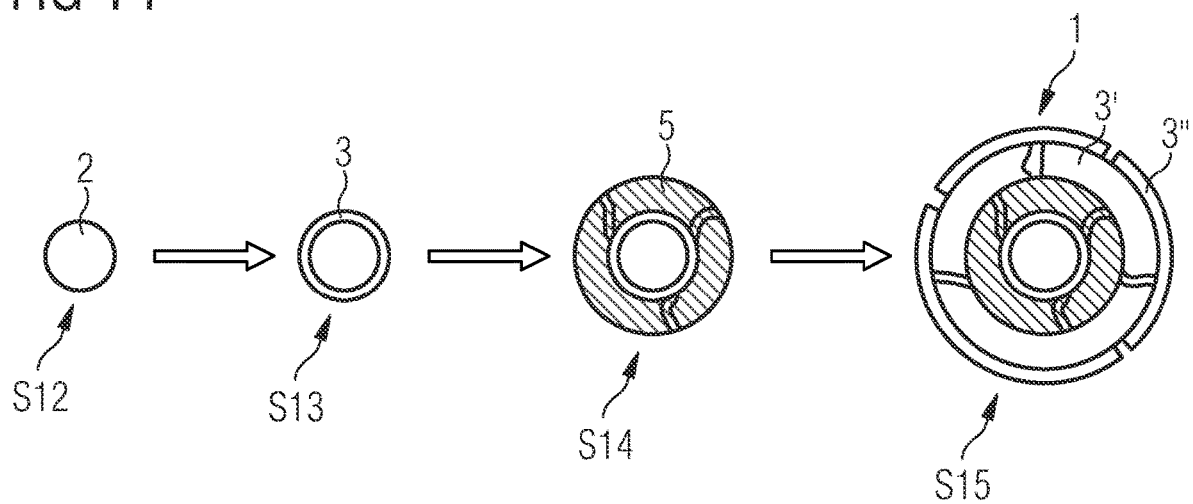

FIG. 14 shows a method for producing a nanoparticle 1 according to an exemplary embodiment by means of schematic sectional views. In a first step S12, a nanocrystal 2 is provided. The nanocrystal 2 has wavelength converting properties. In other words, the nanocrystal 2 is configured to convert electromagnetic radiation of a first wavelength range into electromagnetic radiation of a second wavelength range.

In a second step S13, a first encapsulation 3 is formed. The first encapsulation 3 is formed by treating with tetraethyl orthosilicate. The first encapsulation 3 comprises or consists of silica. The first encapsulation 3 comprises pores 4 which reach into or through the first encapsulation 3.

In a third step S14, a second encapsulation 5 is formed. The second encapsulation 5 is formed by chemical bath deposition. The second encapsulation 5 presently comprises or consists of a semiconductor material such as ZnS. The chemical bath deposition has been described in detail in combination with the second step S9 in FIG. 13.

The second encapsulation 5 is at least partially surrounded by further layers 3′, 3″ of the first encapsulation (fourth step S15). After the first encapsulation 3′, 3″ is formed, the nanocrystal 2 with the first encapsulation 3, 3′, 3″ and the second encapsulation 5 is treated with a base, for example KOH. In this way, the finished nanoparticle 1 is formed after the fourth step S15.

Figure 15:
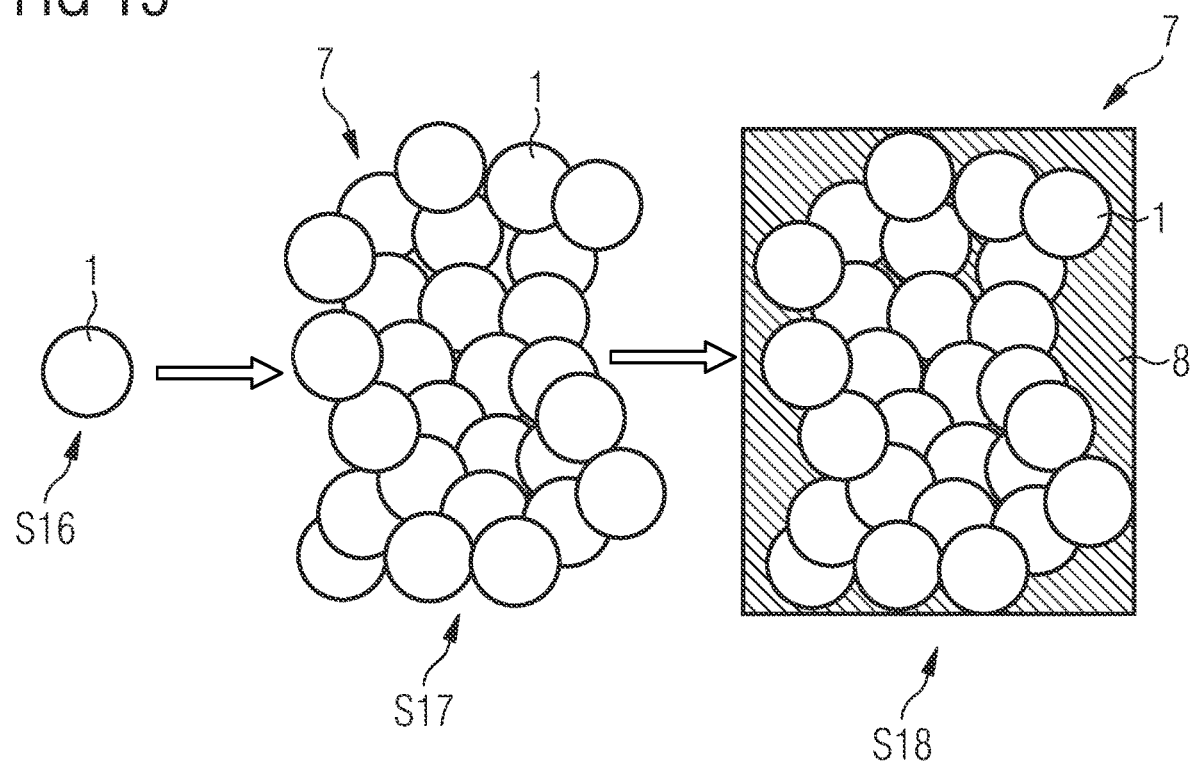
FIG. 15 shows a method for producing a structure according to an exemplary embodiment by means of schematic sectional views.

In combination with FIG. 15, a method for producing a structure is described in detail. In a first step S16, a plurality of nanoparticles 1 are provided. The nanoparticles 1 can have a structure as described in combination with the FIGS. 1 to 6. Alternatively, it is possible that the nanoparticle 1 comprises a nanocrystal 2 and a second encapsulation 5 without a first encapsulation 3. In this case, the second encapsulation 5 comprises a semiconductor material such as ZnS.

In a second step S17, the plurality of nanoparticles 1 is agglomerated or aggregated to form a structure 7. The structure 7 comprises an agglomerate or an aggregate of the plurality of nanoparticles 1. The structure 7 is formed by at least one of adding an anti-solvent, adding a salt, removing the solvent, and combinations thereof. In the structure 7, the nanoparticles 1 are bound to each other by covalent bonds. Additionally or alternatively, the nanoparticles 1 are bound to each other by coordinative bonds.

In a third step S18, a further encapsulation 8 is formed around the plurality of nanoparticles 1. The further encapsulation 8 comprises a material which is similar or different to a material of the first encapsulation 3 and/or the second encapsulation 5 of the nanoparticles 1.

Preferably, the further encapsulation 8 comprises or consists of a semiconductor material such as ZnS. The further encapsulation 8 is applied by one of the methods for forming the first encapsulation 3 or the second encapsulation 5 previously described.

Figure 16:
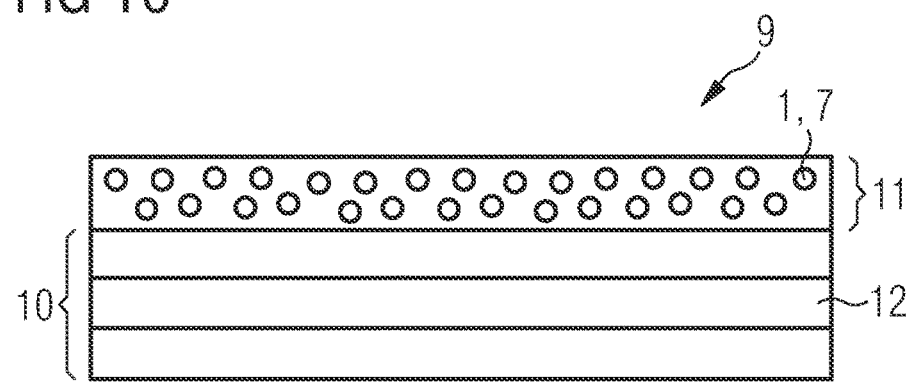
FIG. 16 shows a schematic sectional view of an optoelectronic device according to an exemplary embodiment.

FIG. 16 shows a schematic sectional cross section of an optoelectronic device 9 according to an exemplary embodiment. The optoelectronic device 9 comprises a semiconductor chip 10 and a conversion layer 11. The semiconductor chip 10 comprises an epitaxially grown semiconductor layer sequence with an active layer 12. The semiconductor chip 10 is configured to emit electromagnetic radiation of a first wavelength range. The electromagnetic radiation of the first wavelength range is generated in the active layer 12. Preferably, the first wavelength range is in the UV to blue region of the electromagnetic radiation.

The conversion layer 11 is arranged on a radiation exit surface of the semiconductor chip 10. The conversion layer 11 comprises a plurality of nanoparticles 1 and/or a plurality of structures 7. The nanoparticles 1 have a structure and composition as described in combination with one of FIGS. 1 to 6. The structures 7 have a structure and composition as described in combination with one of FIGS. 7 to 9. The plurality of nanoparticles 1 or structures 7 is embedded in a matrix material, such as an epoxy or a silicone. Alternatively, the conversion layer 11 is free of the matrix material.

The conversion layer 11 converts the electromagnetic radiation of the first wavelength range into electromagnetic radiation of a second wavelength range. The electromagnetic radiation of the first wavelength range is at least partially, preferably completely different than the electromagnetic radiation of the second wavelength range. The second wavelength range is in the visible region of the electromagnetic spectrum.

The features and exemplary embodiments described in connection with the figures can be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

| References | |
|---|---|
| 1, 1′ | nanoparticle |
| 2 | nanocrystal |
| 3, 3′, 3″, 3‴ | first encapsulation |
| 4 | pore |
| 5, 5′, 5″, 5‴ | second encapsulation |
| 6 | metal |
| 7 | structure |
| 8 | further encapsulation |
| 9 | optoelectronic device |
| 10 | semiconductor chip |
| 11 | conversion element |
| 12 | active layer |
| S1, S3, S5, S8, S12, S16 | first step |
| S2, S4, S6, S9, S13, S17 | second step |
| S7, S10, S14, S18 | third step |
| S11, S15 | fourth step |

The invention claimed is:

1. A nanoparticle comprising:
   a nanocrystal configured to convert electromagnetic radiation of a first wavelength range into electromagnetic radiation of a second wavelength range,
   a first encapsulation comprising pores which reach into or through the first encapsulation,
   a second encapsulation which is different from the first encapsulation, wherein the second encapsulation abuts at least one of the pores, wherein
   the first encapsulation comprises a plurality of layers.

2. The nanoparticle according to claim 1, wherein the second encapsulation at least partially fills the pores.

3. The nanoparticle according to claim 1, wherein the first encapsulation comprises an oxide.

4. The nanoparticle according to claim 1, wherein the second encapsulation comprises a material selected from the group of semiconductor materials, silicates, hydroxysilicates, fluorosilicates, and combinations thereof.

5. The nanoparticle according to claim 1, wherein
the second encapsulation comprises a plurality of layers, and
the layers of the first encapsulation and the layers of the second encapsulation are arranged in an alternating manner.

6. The nanoparticle according to claim 1, wherein the first encapsulation and the second encapsulation form a heteromixture.

7. The nanoparticle according to claim 1, wherein a photoluminescence quantum yield of the nanoparticle is at least 85%.

8. A structure comprising a plurality of nanoparticles, wherein the nanoparticles comprise:
a nanocrystal configured to convert electromagnetic radiation of a first wavelength range into electromagnetic radiation of a second wavelength range,
a first encapsulation comprising pores which reach into or through the first encapsulation,
a second encapsulation which is different from the first encapsulation, wherein the second encapsulation abuts at least one of the pores, and
wherein the nanoparticles form an aggregate or agglomerate.

9. The structure according to claim 8, wherein
the structure comprises a further encapsulation, and
the further encapsulation comprises a material selected from the group consisting of: semiconductor materials, oxides, and combinations thereof.

10. The structure according to claim 8, wherein a photoluminescence quantum yield of the structure is at least 85%.

11. A method for producing a nanoparticle, the method comprising:
providing a nanocrystal configured to convert electromagnetic radiation of a first wavelength range into electromagnetic radiation of a second wavelength range,
forming a first encapsulation comprising pores which reach into or through the first encapsulation,
forming a second encapsulation which is different from the first encapsulation, wherein the second encapsulation abuts at least one of the pores, wherein:
the second encapsulation comprises a semiconductor material, and
the semiconductor material is formed by chemical bath deposition or successive ionic layer adsorption, or wherein
the second encapsulation comprises a material selected from the group comprising silicates, hydroxysilicates, fluorosilicates, and combinations thereof, and
the material is formed by applying a metal and subsequent oxidation.

12. The method according to claim 11, wherein the first encapsulation and the second encapsulation are formed at a same time.

13. The method according to claim 11, wherein forming the first encapsulation and/or forming the second encapsulation are repeated at least once.

14. The method according to claim 11, wherein forming the first encapsulation is performed before forming the second encapsulation.

15. The method according to claim 11, wherein forming the second encapsulation is performed before forming the first encapsulation.

16. The method according to claim 11, the method further comprising treating with a base, wherein treating with the base is performed after forming the first encapsulation.

* * * * *